(12) United States Patent
Oshita et al.

(10) Patent No.: US 6,623,663 B2
(45) Date of Patent: Sep. 23, 2003

(54) ELECTROCONDUCTIVE PASTE AND METHOD FOR MANUFACTURING A MULTILAYER CERAMIC ELECTRONIC PART USING THE SAME

(75) Inventors: Kazuhito Oshita, Okayama (JP); Yoshiki Nakagawa, Fukui (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 09/939,467

(22) Filed: Aug. 24, 2001

(65) Prior Publication Data

US 2002/0050586 A1 May 2, 2002

(30) Foreign Application Priority Data

Sep. 7, 2000 (JP) .......................... 2000-271319

(51) Int. Cl.[7] .............. H01B 1/06; H01B 1/02; C09D 5/10
(52) U.S. Cl. .............. 252/511; 252/511; 252/512; 252/518.1; 106/1.13; 156/89.18; 156/89.16
(58) Field of Search ............... 252/511, 512, 252/518.1; 106/1.13; 156/89.16, 89.18

(56) References Cited

U.S. PATENT DOCUMENTS 6,096,411 A * 8/2000 Nakatani et al. ............ 428/209
6,120,708 A * 9/2000 Ohshita et al. ............. 252/511
6,482,899 B2 * 11/2002 Ohashi et al. ............. 525/486

FOREIGN PATENT DOCUMENTS

| JP | 06-096992 | | 4/1994 | |
| JP | 10-172345 | | 6/1998 | |
| JP | 10172345 | * | 6/1998 | ............ H01B/1/16 |
| JP | 63137103 | * | 6/1998 | ............ B22F/1/02 |
| JP | 11-329895 | | 11/1999 | |

* cited by examiner

*Primary Examiner*—Yogendra N. Gupta
*Assistant Examiner*—Kallambella Vijayakumar
(74) *Attorney, Agent, or Firm*—Dickstein, Shapiro, Morin & Oshinsky, LLP.

(57) ABSTRACT

An electroconductive paste is provided containing from about 5% to 18% by weight of an organic vehicle comprising a solvent and a binder, from about 80% to 93% by weight of an electroconductive metal powder in a spherical or granular shape and with a particle diameter in the range of about 0.1 to 50 $\mu$m, and from about 2% to 10% by weight of a resin powder with a particle diameter in the range of about 0.1 to 50 $\mu$m which is insoluble in the solvent and has a low level of water absorption. When this paste is used for forming via hole conductors to be converted to external electrode terminals, there is no problem of shape deformation of the via hole conductors. Furthermore, it is possible to restrict crack generation on the sintered electroconductive metal and to restrict breakage of the ceramic areas in the vicinity of the via hole conductors.

6 Claims, 2 Drawing Sheets

ELECTROCONDUCTIVE PASTE AND METHOD FOR MANUFACTURING A MULTILAYER CERAMIC ELECTRONIC PART USING THE SAME

BACKGROUND OF THE INVENTION

1. Field of the Invention

The present invention relates to an electroconductive paste and a method for manufacturing multilayer ceramic electronic parts using the paste. More particularly, the present invention relates to an electroconductive paste suitable for forming a via hole conductor and a method for manufacturing multilayer ceramic electronic parts using the paste.

2. Description of the Related Art

Japanese Unexamined Patent Application Publication No. 11-329895 is a prior art reference which is interesting for the present invention. It discloses a method for manufacturing multilayer ceramic electronic parts. It teaches basically a method in which a group of electronic parts is formed, and it is then cut along specific division lines to establish a plurality of multilayer ceramic electronic parts.

More specifically, multilayer ceramic electronic parts are provided by the steps of: forming a raw laminate by laminating ceramic green sheets with via hole conductors formed therein which are to be converted to external electrode terminals, and ceramic green sheets with no such via hole conductors formed therein; forming grooves on the raw laminate so as to bisect the via hole conductors; exposing parts of the via hole conductors on the inside surfaces of the grooves; next, firing this raw laminate for sintering; and then, dividing the laminate after sintering along the grooves so as to realize multilayer ceramic electronic parts, wherein the parts of the via hole conductors are converted to the external electrode terminals.

According to this conventional technology, the external electrode terminals can be easily formed even if the allocation pitch is small. It is also possible to perform measurement of properties of individual multilayer ceramic electronic parts on a laminate at the stage after sintering and before the group of electronic parts is divided along the grooves.

On the other hand, Japanese Unexamined Patent Application Publication No. 10-172345 discloses an electroconductive paste which can be advantageously used for forming via hole conductors. It teaches that this electroconductive paste contains a resin powder composed of a resin such as a crystalline cellulose that is insoluble in a solvent contained in the paste, and accordingly, cracks in the via hole conductors or breaking of the peripheral ceramic areas are prevented from occurring at the time of firing, and therefore, via hole conductors can be formed, which have a high reliability of electroconductance and an excellent solderability as well as an excellent plating capability.

However, even if the electroconductive paste disclosed in Japanese Unexamined Patent Application Publication No. 10-172345 is used as the electroconductive paste for forming via hole conductors in the method for manufacturing multilayer ceramic electronic parts disclosed in Japanese Unexamined Patent Application Publication No. 11-329895, there would be a problem in that the via hole conductors are deformed due to their volume expansion caused by water absorption of the resin powder existing in the electroconductive paste for forming the via hole conductors when a dicing saw is employed in performing the step of forming grooves on a raw laminate for bisecting the via hole conductors, so that parts of the via hole conductors are exposed to be converted to external electrode terminals. This is because water is usually sprayed when a dicing saw is employed.

SUMMARY OF THE INVENTION

Accordingly, it is an object of the present invention to provide an electroconductive paste that can solve such a problem and to provide a method for manufacturing multilayer ceramic electronic parts using the paste.

The present invention is first directed to an electroconductive paste used for forming a via hole conductor in a method for manufacturing a multilayer ceramic electronic part comprising the steps of: manufacturing a raw laminate composed of a plurality of laminated ceramic green sheets including ceramic green sheets with the via hole conductor therein; and cutting the raw laminate at an area where the via hole conductor is located, and exposing part of the via hole conductor on the cut surface, so that the via hole conductor is converted to an external electrode terminal. To solve the above-described technical problems, the electroconductive paste comprises: from about 5% to 18% by weight of an organic vehicle comprising a solvent and a binder; from about 80% to 93% by weight of an electroconductive metal powder in a spherical or granular shape and with a particle diameter in the range of about 0.1 to 50 $\mu$m; and from about 2% to 10% by weight of a resin powder with a particle diameter in the range of about 0.1 to 50 $\mu$m that is insoluble in the above-described solvent and has a low level of water absorption.

As the above-described electroconductive metal powder, a copper powder can be used, for example.

It is also preferable that the resin powder is a polypropylene powder.

Another aspect of the electroconductive paste according to the present invention is characterized in that it contains an electroconductive metal powder, an organic vehicle, and from about 2% to 10% by weight of a polypropylene powder. The electroconductive paste according to the present invention can be used not only for forming the above-described via hole conductors but also for other applications.

In the above-described aspect of the present invention, the electroconductive paste preferably comprises from about 80% to 93% by weight of the electroconductive metal powder, and from about 5% to 18% by weight of the organic vehicle.

The present invention is also directed to a method for manufacturing a multilayer ceramic electronic part comprising the steps of: manufacturing a raw laminate composed of a plurality of laminated ceramic green sheets including ceramic green sheets with a via hole conductor therein; cutting the raw laminate at an area where the via hole conductor is located, and exposing part of the via hole conductor on the cut surface, so that the via hole conductor is converted to an external electrode terminal; and firing the raw laminate having the via hole conductor partly exposed on the cut surface for sintering. This manufacturing method is characterized in that the above-described electroconductive paste is used as an electroconductive paste for forming the via hole conductor.

Other objects, advantages, and novel features of the present invention will become more apparent from the following detailed description when taken in conjunction with the accompanying drawings.

DESCRIPTION OF THE PREFERRED EMBODIMENTS

Although the present invention will be described with reference to the following figures and examples, it is to be understood that the invention is not limited to the precise embodiments described below, and various changes and modifications may be made to various usages and conditions without departing from the spirit and scope of the invention as described in the claims that follow.

Figure 1:
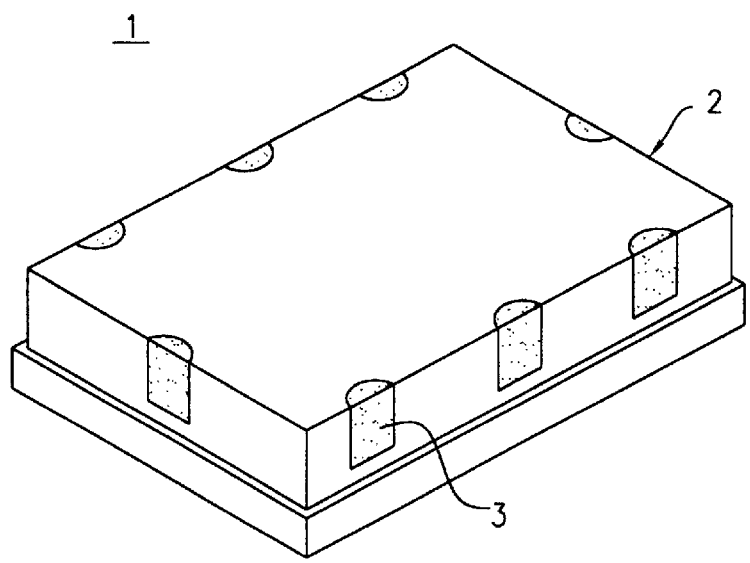
FIG. 1 is a perspective view showing the outer appearance of a multilayer ceramic electronic part 1 obtained by the manufacturing method according to one embodiment of the present invention.

FIG. 1 is a perspective view showing the outer appearance of a multilayer ceramic electronic part 1 obtained by the manufacturing method according to one embodiment of the present invention. The multilayer ceramic electronic part 1 is mounted on an appropriate circuit board in the form of a chip as shown in FIG. 1. FIG. 1 shows the multilayer ceramic electronic part 1 with the surface that is to be directed to such a circuit board facing upwards.

The multilayer ceramic electronic part 1 comprises a multilayer chip 2 composed of a plurality of laminated ceramic layers with internal wiring conductors such as conductive films or via hole conductors formed therein. External electrode terminals 3 are formed exposed on the outer surfaces of the multilayer chip 2, for example, on the four side surfaces. These external electrode terminals 3 are electrically connected to any of the above-described internal wiring conductors which are not shown in the figure.

The multilayer ceramic electronic part 1 in FIG. 1 is manufactured according to the following method.

Figure 2:
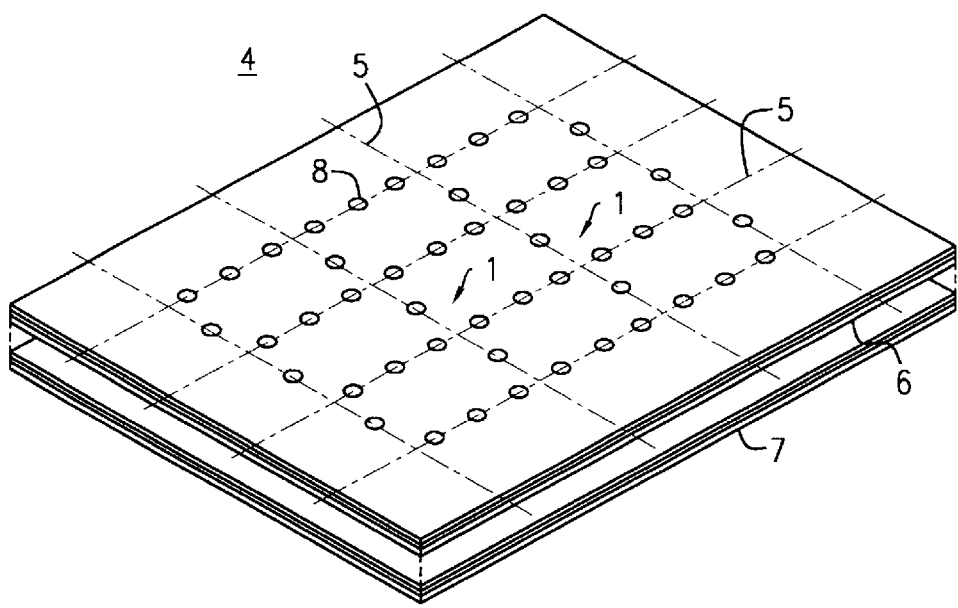
FIG. 2 is a perspective view showing a mother laminate 4 prepared for obtaining the multilayer ceramic electronic part 1 shown in FIG. 1.

First, a raw mother laminate 4 is prepared as shown in FIG. 2. The mother laminate 4 is divided along specified division lines 5 to provide a plurality of multilayer ceramic electronic parts 1. It is obtained by laminating a plurality of mother ceramic green sheets 6 and 7, wherein internal wiring conductors (not shown in the figure) are arranged to be properly located in each area to be divided by the division lines 5 to form each multilayer ceramic electronic part 1.

In the mother ceramic green sheets 6 that are located in the relatively upper side of the mother laminate 4 in FIG. 2, via hole conductors 8 are formed at areas where they are to be bisected along the division lines 5. Parts of these via hole conductors 8 will be converted to the external electrode terminals 3 shown in FIG. 1.

The following steps are employed, for example, in order to obtain the above-described mother laminate 4.

First, the mother ceramic green sheets 6 and 7 are obtained by performing sheet molding according to a doctor blade method or the like. Through holes are formed by punching or by other methods in order to form the via hole conductors 8 the mother ceramic green sheets 6 that are to be located in the relatively upper side of the mother laminate 4.

Furthermore, other through holes are formed in a similar way in order to form via hole conductors in the specific layers of the mother ceramic green sheets 6 and 7 for electrically connecting to conductive films acting as internal wiring conductors that are not shown in FIG. 2.

Next, the conductive films to act as the internal wiring conductors are formed by printing with an electroconductive paste on specific layers of the mother ceramic green sheets 6 and 7. At that time, the through holes described above are filled with the electroconductive paste. The electroconductive paste is then dried.

It is to be noted that filling of the through holes with the electroconductive paste and printing of the conductive films with the electroconductive paste may be carried out in separate steps.

Also, the electroconductive paste for forming the via hole conductors 8 and the electroconductive paste for forming the via hole conductors as the internal wiring conductors may have different compositions from each other. The composition of the electroconductive paste for forming the via hole conductors 8 to be converted to the external electrode terminals 3 will be described later.

Next, the above-described mother ceramic green sheets 6 and 7 are laminated and pressed to form the raw mother laminate 4. In this mother laminate 4, the via hole conductors 8 are formed in each layer of the plural mother ceramic green sheets 6, as aligned in the thickness direction.

Figure 3:
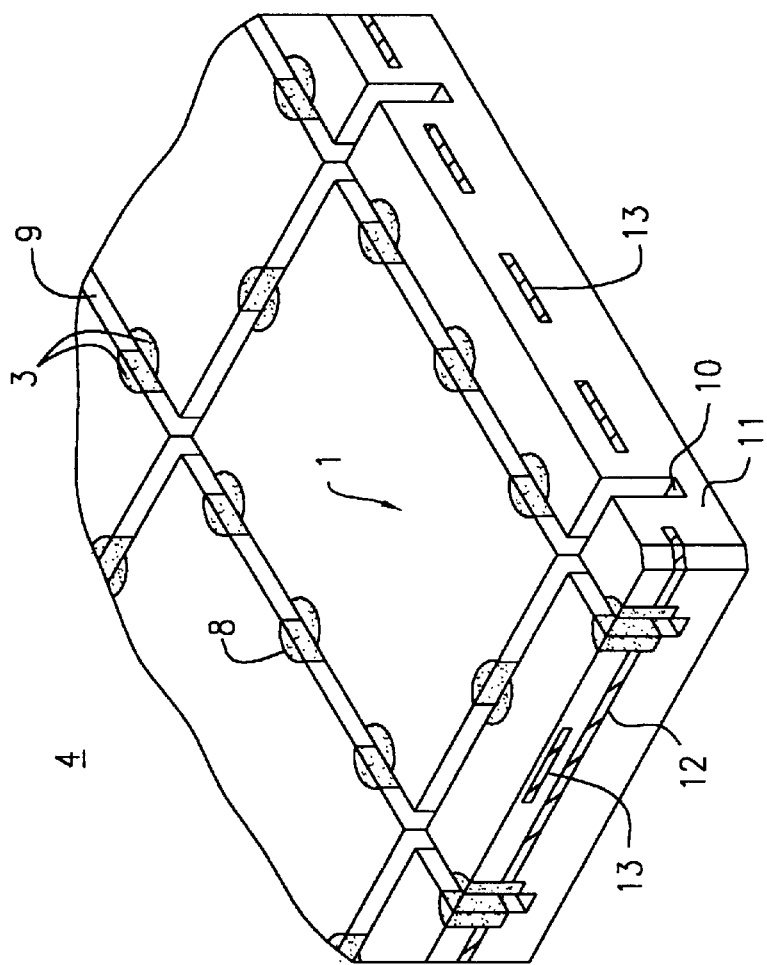
FIG. 3 is an enlarged perspective view showing the mother laminate 4 with grooves 9 thereon, as shown in FIG. 2.

Next, the grooves 9 are formed, as shown in FIG. 3, along the division lines 5 (see FIG. 2) on the raw mother laminate 4 at areas where the via hole conductors 8 are located, so as to bisect them. Parts of the via hole conductors 8 are exposed on the inside surfaces of the grooves 9 by the formation of these grooves 9. Furthermore, the areas enclosed by the grooves 9 that are to be individual multilayer ceramic electronic parts 1 become electrically independent from each other.

A dicer is employed for forming the above-described grooves 9. An aqueous solution is sprayed around the grooves at the time of forming the grooves 9 with the dicer.

It is to be noted that slits 10 and 11 may be formed on the bottoms of the grooves 9 and on the bottom surface of the mother laminate 4 at the corresponding locations, respectively. Either the slits 10 or 11 may be omitted.

In FIG. 3, some of the conductive films 12 and 13 are shown, as acting as internal wiring conductors. It is also shown that the conductive film 12 is electrically connected to the via hole conductors 8.

Next, the firing step is performed so as to sinter the raw laminate 4. Then, conductive films and resistor films are formed on the surface of the sintered mother laminate 4, as necessary. Furthermore, overcoating is applied. A solder resist is also applied. Furthermore, plating is carried out on the external electrode terminals 3 that are made of parts of the via hole conductors 8, and on the conductive films, as necessary.

When all the above-described steps are completed, the plural multilayer ceramic electronic parts 1 contained in the mother laminate 4 are electrically independent from each other. Accordingly, properties of each multilayer ceramic electronic part 1 can be determined via the external electrode terminals 3 that have been obtained by bisecting the via hole conductors 8 along the grooves 9.

After performing the measurement of the properties in this way, other electronic parts are mounted, as necessary, on the multilayer ceramic electronic parts 1 that have been determined as good parts, for manufacturing composite parts.

Next, the mother laminate 4 is divided along the division lines 5 (FIG. 2) or the grooves 9 (FIG. 3). This division is easily achieved by cutting the mother laminate 4 along the grooves 9. The slits 10 and 11 described above are formed so as to make the division more easily.

In this way, the multilayer ceramic electronic parts 1 as shown in FIG. 1 are made from the mother laminate 4. Parts of the via hole conductors 8 have been converted to the external electrode terminals 3 of these multilayer ceramic electronic parts 1.

The via hole conductors 8 to be converted to the external electrode terminals 3 have a circular cross-section in the embodiment as shown in the figures. It is to be noted, however, that other cross-sectional forms may be acceptable including a square form. Furthermore, one external electrode terminal may be made of a plurality of via hole conductors that have cross-sections partially overlapped with each other, in other words, made of a via hole conductor having an oblong cross-section, so that a wider area of the external electrode terminal is exposed.

Furthermore, apart from the considerations on the efficiency of the property measurements of each multilayer ceramic electronic part 1 or the efficiencies of the formation of the conductive films and resistor films, plating, or other steps performed relative to each multilayer ceramic electronic part 1, it may be possible to divide the raw mother laminate 4 along the division lines 5, and then to subject the multilayer chips 2 after the division (see FIG. 1) to a firing step.

Furthermore, it is acceptable to fill the through holes formed on each layer of the mother ceramic green sheets 6 with an electroconductive paste before lamination for forming the via hole conductors 8. Otherwise, an electroconductive paste may be filled at once into the through holes aligned in straight rows in the plural mother ceramic green sheets 6 which have been laminated.

Furthermore, in the above-described embodiment, the grooves 9 are formed, as shown in FIG. 3, extending continuously, enclosing the areas to be respective multilayer ceramic electronic parts 1. However, they may be formed in a discontinuous way only around the areas where the via hole conductors 8 are located. In this case, the grooves may be formed with through holes.

In the embodiment as shown in the figures, the multilayer ceramic electronic parts 1 are manufactured by preparing the mother laminate 4, and dividing it to make a plurality of multilayer ceramic electronic parts 1. However, it is possible to manufacture one multilayer ceramic electronic part 1 by preparing a laminate, forming grooves on this laminate at areas where via hole conductors are located, and cutting the laminate along the division lines formed with the grooves to remove peripheral areas of the laminate so that only one multilayer ceramic electronic part 1 is made from the laminate.

In the above-described manufacturing method, an electroconductive paste is used for forming the via hole conductors 8 to be converted to the external electrode terminals 3, which comprises from about 5% to 18% by weight of an organic vehicle comprising a solvent and a binder, from about 80% to 93% by weight of an electroconductive metal powder in a spherical or granular shape and with a particle diameter in the range of about 0.1 to 50 µm, and from about 2% to 10% by weight of a resin powder with a particle diameter in the range of about 0.1 to 50 µm that is insoluble in the above-described solvent and has a low level of water absorption.

By low water absorption is meant a resin powder having 10% or less of volume growth by water absorption. Useful resins include polypropylene.

By employing this paste, it is possible to make it more difficult for the resin powder to absorb water, which may exist in the electroconductive paste for forming the via hole conductors 8 after the drying step, so that the shape of the electroconductive paste is prevented from being deformed due to volume expansion when the grooves 9 are being formed using a dicing saw so as to cut out the raw mother laminate 4 at areas where the via hole conductors 8 are located.

Furthermore, it is possible for the resin powder to retard the shrinkage of the electroconductive metal powder due to sintering at the firing step, resulting in prevention of crack generation on the electroconductive sintered metal and prevention of breakage generation in the peripheral ceramic areas after the firing.

Furthermore, since the resin powder is decomposed and eliminated during the firing step, the external electrode terminals 3 obtained from the via hole conductors 8 can acquire excellent soldering and plating characteristics.

An electroconductive metal powder in a spherical or granular shape is used for the electroconductive paste. This is because the filling characteristics of the electroconductive metal powder to fill the through holes is improved when it has a spherical or granular shape.

The reason for limiting the particle diameter of the electroconductive metal powder to the range of from about 0.1 to 50 µm is that when the particle diameter is less than about 0.1 µm, the viscosity of the electroconductive paste is increased and that the surface of the metal powder is more susceptible to oxidation, with the result that the electroconductive resistance characteristics are more liable to be degraded when a base metal powder is used as the electroconductive metal powder. On the other hand, when the particle diameter exceeds about 50 µm, it is not suitable for screen printing.

The reason for limiting the content of the electroconductive metal powder to the range of from about 80% to 93% by weight, is that when the content is less than about 80% by weight, the filling density of the electroconductive metal powder in the through holes is insufficient. On the other hand, when the content exceeds about 93% by weight, it is difficult to make a paste using the powder due to excessive rate of the solid components.

Furthermore, it is specified that the resin powder for the electroconductive paste that is insoluble in a solvent contained in the paste, and has a low level of water absorption, should have a particle diameter in the range of from about 0.1 to 50 µm. The reason is that if the diameter is less than about 0.1 µm, the viscosity of the electroconductive paste is increased, and that if it exceeds about 50 µm, it is not suitable for screen printing.

It is also preferable for the resin powder to have a spherical or granular shape, from the viewpoint of improved filling characteristics. However, as the content is relatively small, powders having a flat shape such as flakes can be also used.

The content of this resin powder should be in the range of from about 2% to 10% by weight. The reason is that when the content is less than about 2% by weight, the sintered electroconductive metal existing in the external electrode terminals 3 after the division of the via hole conductors 8 is susceptible to cracking. On the other hand, when the content exceeds about 10% by weight, there is a tendency that many voids are generated in the external electrode terminals 3, with the result that the electroconductive resistance characteristics as well as the soldering and plating characteristics tend to be degraded.

For the electroconductive paste according to the present invention, various organic vehicles that are commonly used for electroconductive pastes for forming thick films can be used. It is preferable to select an appropriate organic vehicle in consideration of its combination with the binder used for the mother ceramic green sheets 6. It is to be noted that an organic vehicle prepared by dissolving an ethyl cellulose resin as an organic binder in a terpineol type solvent is a preferable example of the organic vehicle.

As the above-described electroconductive metal powder, a copper powder can be advantageously used, for example. Besides a copper powder, powders composed of a copper compound, a base metal such as nickel or an alloy thereof, as well as a noble metal such as gold, silver, platinum or palladium, or an alloy thereof, can be used in some cases.

As the resin powder that is insoluble in a solvent contained in the paste and has a low level of water absorption, a polypropylene powder can be preferably used.

The electroconductive paste according to the present invention is particularly advantageously used for the specific application for forming the via hole conductors 8 to be converted to the external electrode terminals 3 as described above. However, it may be employed for a different application. For example, this electroconductive paste can be used for forming electroconductive films or via hole conductors as wiring conductors in multilayer ceramic electronic parts. It can be also used for forming electroconductive films or the like for electronic parts other than multilayer ceramic electronic parts.

When it is considered that this electroconductive paste can be employed for various applications, there may be occasions when only the condition that the paste contains an electroconductive metal powder, an organic vehicle, and from about 2% to 10% by weight of a polypropylene powder is sufficient for the composition of the electroconductive paste specified in the present invention.

The following are examples carried out for confirming the effects of the electroconductive paste according to the present invention. It goes without saying that the types of the ceramics, binders, etc., and the structure of the multilayer ceramic board, etc. appeared in the examples represent only some examples, and various modifications and application of various alternatives can be made within the scope of the present invention.

EXAMPLES

First, a $BaO$—$Al_2O_3$—$SiO_2$ glass composite material powder was prepared as a ceramic material. Next, polyvinyl butyral as an organic binder and toluene as an organic solvent were added to this powder, followed by kneading to form a raw material slurry. Then ceramic green sheets were formed from this raw material slurry by a doctor blade method. Next, through holes for via hole conductors were formed in the ceramic green sheets by punching.

On the other hand, a spherical particle copper powder having a particle diameter in the range of from about 0.1 to 50 µm, a resin powder having a particle diameter in the range of from about 0.1 to 50 µm, and an organic vehicle prepared by dissolving an ethyl cellulose resin into a terpineol type solvent were prepared. Then the copper powder, the resin powder, and the organic vehicle were kneaded with a three-roll mill to make electroconductive pastes of Samples 1 to 11 with compositions shown in Table 1.

It is to be noted that a polypropylene powder was used as a resin powder for Samples 1 to 10, while a crystalline cellulose powder was used as a resin powder for Sample 11.

TABLE 1

| Sample No. | Electroconductive paste | | | Evaluation | | | | |
| --- | --- | --- | --- | --- | --- | --- | --- | --- |
| | Copper powder (wt. %) | Resin powder (wt. %) | Organic vehicle (wt. %) | Deformation of via hole conductor at dicing | Cracks on external electrode terminal | Breakage of ceramic areas | Plating capability | Solderability |
| 1* | 85 | 0 | 15 | No | Yes | No | ○ | ○ |
| 2* | 85 | 1 | 14 | No | Yes | No | ○ | ○ |
| 3 | 80 | 2 | 18 | No | No | No | ○ | ○ |
| 4 | 85 | 5 | 10 | No | No | No | ○ | ○ |
| 5 | 93 | 2 | 5 | No | No | No | ○ | ○ |
| 6 | 90 | 5 | 5 | No | No | No | ○ | ○ |
| 7 | 80 | 10 | 10 | No | No | No | ○ | ○ |
| 8* | 80 | 15 | 5 | No | Yes (voids) | No | x | x |
| 9* | 94 | 2 | 4 | Paste formation failed. | | | | |
| 10* | 75 | 10 | 15 | Yes (insufficient filling) | Yes (insufficient filling) | No | Δ | Δ |
| 11* | 85 | 5 | 10 | Yes | Yes | No | Δ | Δ |

Remarks: the symbol ○ stands for good, the symbol Δ stands for moderate, and the symbol x stands for bad.

Next, electroconductive pastes for the Samples were filled, according to a screen printing method, into through holes for via hole conductors that had been formed in the ceramic green sheets previously prepared, followed by drying. Then, conductive films were formed as wiring conductors on the ceramic green sheets, also according to a screen printing method.

Next, raw laminates were prepared by laminating the plural ceramic green sheets described above, followed by pressing. Grooves were formed applying a dicing saw on to the raw laminates at areas where the via hole conductors were located bisecting the via hole conductors. Parts of the via hole conductors were exposed on the inside surfaces of the grooves by this groove formation. Slits were formed at the bottoms of the grooves as well as on the bottom surfaces of the laminates at the corresponding locations.

Next, the raw laminates as described above were subjected to firing in an nitrogen atmosphere at a temperature of 980° C. for one to two hours to form sintered laminates. Then the laminates were subjected to a degreasing treatment with a solvent to remove oily substances and oxide films on the surfaces of the external electrode terminals made of the above-described bisected via hole conductors and on the surfaces of other conductive films. After that, they were subjected to an activation treatment with a palladium solution, followed by electroless nickel plating.

Next, the mother laminates thus obtained were divided along the grooves to form independent plural multilayer ceramic electronic parts.

Evaluations on the various items shown in Table 1 were carried out after completion of the multilayer ceramic electronic parts or in the middle of the manufacturing steps as described above.

In Table 1, the "deformation of via hole conductor at dicing" was evaluated for the samples by the existence or nonexistence of deformation through observation of the shapes of the bisected via hole conductors after the grooves were formed using the dicing saw for bisecting them.

The "cracks on external electrode terminal" was evaluated by the existence or nonexistence of cracks on the sintered electroconductive metal through cutting the obtained multilayer ceramic electronic parts so that the cross-sections of the external electrode terminals made of the via hole conductors after sintering were exposed, and observing the cross-sections with a stereoscopic microscope.

The "breakage of ceramic" was evaluated by the existence or nonexistence of breakage of the ceramic areas through observation of the cross-section of the ceramic areas in the vicinity of the external electrode terminals with a stereoscopic microscope, as performed in the above-described "cracks on external electrode terminal" evaluation.

The "plating capability" was evaluated by observing, with a scanning electron microscope, the surfaces of the electroless-plated films formed on the surfaces of the external electrode terminals formed by bisecting the via hole conductors.

The "solderability" was evaluated also by performing soldering on the surfaces of the external electrode terminals, and observing the state of soldering.

In Table 1, the sample numbers with an asterisk represent comparative examples that are out of the scope of the present invention.

In reference to Table 1, when the content of the copper powder exceeded about 93% by weight as in the case of Sample 9, it was not possible to make a paste with the result that no evaluation was performed.

When the content of the copper powder was less than about 80% by weight, as was in the case of Sample 10, deformation of the shape of the via hole conductors occurred at dicing, cracks were formed on the external electrode terminals and filling of the through holes with the electroconductive paste was insufficient. Not very good results were achieved regarding the plating capability and the solderability.

When the content of the polypropylene powder as a resin powder was less than about 2% by weight, as in the cases of Examples 1 and 2, crack generation was observed on the external electrode terminals.

On the other hand, when the content of the polypropylene powder as a resin powder exceeded about 10% by weight, as in the case of Example 8, not only was crack generation observed on the external electrode terminals but also voids were observed. The plating capability and solderability were also inferior.

When the crystalline cellulose powder was used as a resin powder, as in the case of Sample 11, the resin powder expanded by absorbing water in the course of dicing, with the result that the via hole conductors were deformed.

In comparison, when the copper powder was in the range of from about 80% to 93% by weight, the resin powder was in the range of from about 2% to 10% by weight and the organic vehicle was in the range of from about 5% to 18% by weight in the samples in which the polypropylene powder was used as a resin powder, as in the cases of Samples 3 to 7, the electroconductive pastes for the via hole conductors were not deformed in the course of dicing, neither cracks on the external electrode terminals nor breakage of the ceramic areas occurred after firing, and excellent plating capability and solderability were realized on the external electrode terminals.

This is because a specific content of the polypropylene powder that was insoluble in a solvent contained in the electroconductive paste and had a low level of water absorption was included as a resin powder in the electroconductive pastes. Due to this, the filling capability of the electroconductive pastes into the through holes for forming the via hole conductors was improved. Furthermore, it was possible to prevent volume expansion due to water absorption, to retard the shrinkage of the electroconductive metal due to sintering in the step of firing, and to restrict crack generation and breakage of the ceramic areas. Also, there was no adverse effect on the plating capability and the solderability since the resin powder was decomposed and eliminated in the firing.

Since the electroconductive paste according to the present invention contains a specific content of a resin powder that is insoluble in a solvent contained in the paste and has a low level of water absorption, the following effects are realized.

When this electroconductive paste is used for forming via hole conductors, the filling capability of the electroconductive paste into through holes for forming the via hole conductors is improved, and therefore, it is possible to prevent from defects caused by insufficient filling of the through holes with the electroconductive paste.

When this electroconductive paste is used for forming via hole conductors to be converted to external electrode terminals, there is no problem of shape deformation of the electroconductive paste for forming the via hole conductors in the step of cutting a raw laminate at areas where the via hole conductors are located using a dicing saw. Furthermore, it is possible for the resin powder to retard the shrinkage of the electroconductive metal powder due to sintering at the step of firing, and to restrict crack generation on the sintered electroconductive metal and generation of breakage of the ceramic areas in the vicinity of the via hole conductors after firing.

Since the resin powder contained in the electroconductive paste is decomposed and eliminated in the course of firing, there is no adverse effect on the plating capability as well as on the solderability of a conductor formed from the electroconductive paste.

From these results, it is concluded that a conductor having a high reliability of electroconductance as well as excellent plating capability and excellent solderability can be obtained by applying this electroconductive paste.

In particular, when external electrode terminals of a multilayer ceramic electronic part are formed by using this electroconductive paste for forming via hole conductors, bisecting a raw laminate at areas where the via hole conductors are located to expose parts of the via hole conductors on the bisected surfaces, and converting the exposed parts of the via hole conductors to the external electrode terminals, it is possible to have external electrode terminals with enhanced electroconductance reliability, and to manufacture multilayer ceramic electronic parts efficiently.

When a copper powder is used as an electroconductive metal powder contained in the electroconductive paste, it is possible to acquire a conductor at a relatively inexpensive cost, which has a small specific resistance and which hardly allows migration to occur.

Furthermore, when a polypropylene powder is used as a resin powder that is insoluble in a solvent contained in the paste and has a low level of water absorption, the effects of the present invention can be realized without fail, and it is possible to manufacture multilayer ceramic electronic parts having conductors such as external electrode terminals with good electric properties without fail, for example.

What is claimed is:

1. An electroconductive paste useful for forming a via hole conductor in a method for manufacturing a multilayer ceramic electronic part comprising manufacturing a raw laminate comprising laminated ceramic green sheets including a ceramic green sheet with said via hole conductor therein, and cutting said raw laminate at an area where said via hole conductor is located and exposing part of said via hole conductor on the cut surface, so that said via hole conductor is converted to an external electrode terminal, the paste comprising:

from about 5% to 18% by weight of an organic vehicle comprising a solvent and a binder;

from about 80% to 93% by weight of an electroconductive metal powder in a spherical or granular shape and with a particle diameter in the range of about 0.1 to 50 μm; and from about 2% to 10% by weight of a polypropylene resin powder that is insoluble in said solvent and has a low level of water absorption and which has a particle diameter in the range of about 0.1 to 50 μm.

2. An electroconductive paste according to claim 1, wherein said electroconductive metal powder is a copper powder.

3. An electroconductive paste comprising an electroconductive metal powder, an organic vehicle and from about 2% to 10% by weight of a polypropylene powder.

4. An electroconductive paste according to claim 3, comprising from about 80% to 93% by weight of said electroconductive metal powder, and from about 5% to 18% by weight of said organic vehicle.

5. An electroconductive paste according to claim 4, wherein the electroconductive metal powder has a spherical or granular shape and a particle diameter in the range of about 0.1 to 50 μm, and the polypropylene powder has a particle diameter in the range of about 0.1 to 50 μm.

6. An electroconductive paste according to claim 5, wherein said electroconductive metal powder is a copper powder.

* * * * *